(12) United States Patent
Kim et al.

(10) Patent No.: US 9,188,626 B2
(45) Date of Patent: Nov. 17, 2015

(54) SEMICONDUCTOR APPARATUS AND TEST METHOD THEREOF

(71) Applicant: SK hynix Inc., Icheon-si Gyeonggi-do (KR)

(72) Inventors: Chul Kim, Icheon-si (KR); Jong Chern Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 341 days.

(21) Appl. No.: 13/723,474

(22) Filed: Dec. 21, 2012

(65) Prior Publication Data

US 2014/0043057 A1    Feb. 13, 2014

(30) Foreign Application Priority Data

Aug. 8, 2012 (KR) ........................ 10-2012-0086682

(51) Int. Cl.
| | | |
|---|---|---|
| *G01R 31/02* | (2006.01) | |
| *G01R 31/26* | (2014.01) | |
| *G01R 31/28* | (2006.01) | |
| *G11C 29/02* | (2006.01) | |
| *G11C 29/12* | (2006.01) | |
| *G11C 29/48* | (2006.01) | |
| *G01R 31/3185* | (2006.01) | |

(52) U.S. Cl.
CPC ........ *G01R 31/2637* (2013.01); *G01R 31/2853* (2013.01); *G11C 29/022* (2013.01); *G11C 29/025* (2013.01); *G11C 29/1201* (2013.01); *G11C 29/48* (2013.01); *G01R 31/318513* (2013.01)

(58) Field of Classification Search
None
See application file for complete search history.

(56) References Cited

U.S. PATENT DOCUMENTS

| | | | |
|---|---|---|---|
| 8,792,247 B2 * | 7/2014 | Hollis | 361/760 |
| 2010/0013512 A1 * | 1/2010 | Hargan et al. | 324/765 |
| 2011/0102006 A1 * | 5/2011 | Choi et al. | 324/750.3 |

FOREIGN PATENT DOCUMENTS

KR    1020110046894 A    5/2011

* cited by examiner

*Primary Examiner* — Paresh Patel
(74) *Attorney, Agent, or Firm* — Willaim Park & Asociates Ltd.

(57) ABSTRACT

A semiconductor apparatus includes a test voltage application unit, a first pad and a second pad. The test voltage application unit is configured to apply a test voltage to first and second TSVs in response to a test mode signal. The first pad is configured to output a first test signal outputted from the first TSV. And the second pad is configured to output a second test signal outputted from the second TSV.

15 Claims, 3 Drawing Sheets

SEMICONDUCTOR APPARATUS AND TEST METHOD THEREOF

CROSS-REFERENCES TO RELATED APPLICATION

The present application claims priority under 35 U.S.C. §119(a) to Korean application number 10-2012-0086682, filed on Aug. 8, 2012, in the Korean Intellectual Property Office, which is incorporated herein by reference in its entirety.

BACKGROUND

1. Technical Field

The present invention generally relates to a semiconductor apparatus, and more particularly, to a three-dimensional (3D) semiconductor apparatus including a plurality of chips stacked therein.

2. Related Art

In order to increase the integration degree of a semiconductor apparatus, a 3D semiconductor apparatus including a plurality of chips stacked and packaged in a single package has been developed. Recently, a through-silicon via (TSV) method has been used, in which a plurality of stacked chips are electrically connected through TSVs.

The 3D semiconductor apparatus includes a plurality of TSVs through which the plurality of stacked chips commonly receives various signals. For example, in the case of a memory apparatus, a plurality of stacked chips commonly receive an address signal, signals for various tests, and input/output line and command signals through the TSVs.

The TSV may have various defects. For example, when the TSV is not completely filled with a conductive material, a void may occur. Furthermore, when a chip is bent or a bump material is moved, a bump contact fail may occur. Furthermore, a crack may occur in the TSV. As described above, the TSV electrically connects a plurality of chips. Therefore, when a defect occurs to open the TSV, the TSV does not perform a normal function. Therefore, a test process of accurately detecting a TSV in which a defect occurred and a repair process of replacing the TSV which has the defect with a normal TSV is required.

SUMMARY

A semiconductor apparatus capable of efficiently testing whether TSVs are normally formed or not is described herein.

In an embodiment, there is provided a semiconductor apparatus including a plurality of chips stacked therein and first and second TSVs electrically connecting the plurality of chips. The semiconductor apparatus includes: a test voltage application unit configured to apply a test voltage to the first and second TSVs in response to a test mode signal; a first pad configured to output a first test signal outputted from the first TSV; and a second pad configured to output a second test signal outputted from the second TSV.

In an embodiment, there is provided a semiconductor apparatus which includes a plurality of chips and a plurality of TSVs electrically connecting the plurality of chips and divided into first and second ranks. The semiconductor apparatus: a test voltage application unit configured to apply a test voltage to the plurality of TSVs in response to a test mode signal; a first test signal output unit sequentially connected to the TSVs of the first rank and configured to output a first test signal; a second test signal output unit sequentially connected to the TSVs of the second rank and configured to output a second test signal; a first pad configured to output the first test signal; and a second pad configured to output the second test signal.

In an embodiment, there is provided a test method of a semiconductor apparatus which includes a plurality of chips and first and second TSVs electrically connecting the plurality of chips. The test method includes the steps of: applying a test voltage to the first and second TSVs; converting signals outputted through the first and second TSVs into first and second digital signals, respectively; and outputting the first and second digital signals to first and second pads, respectively.

In an embodiment, there is provided a test method of a semiconductor apparatus which includes a plurality of chips and a plurality of TSVs electrically connecting the plurality of chips and divided into first and second ranks. The test method includes the steps of: applying a test voltage to the plurality of TSVs; outputting signals outputted from one of the TSVs of the first rank and one of the TSVs of the second rank to first and second pads, respectively; and outputting signals outputted from another of the TSVs of the first rank and another of the TSVs of the second rank to the first and second pads, respectively.

BRIEF DESCRIPTION OF THE DRAWINGS

Features, aspects, and embodiments are described in conjunction with the attached drawings, in which.

DETAILED DESCRIPTION

Hereinafter, a semiconductor apparatus and a test method thereof according to the various embodiments will be described below with reference to the accompanying drawings through the embodiments.

Figure 1:
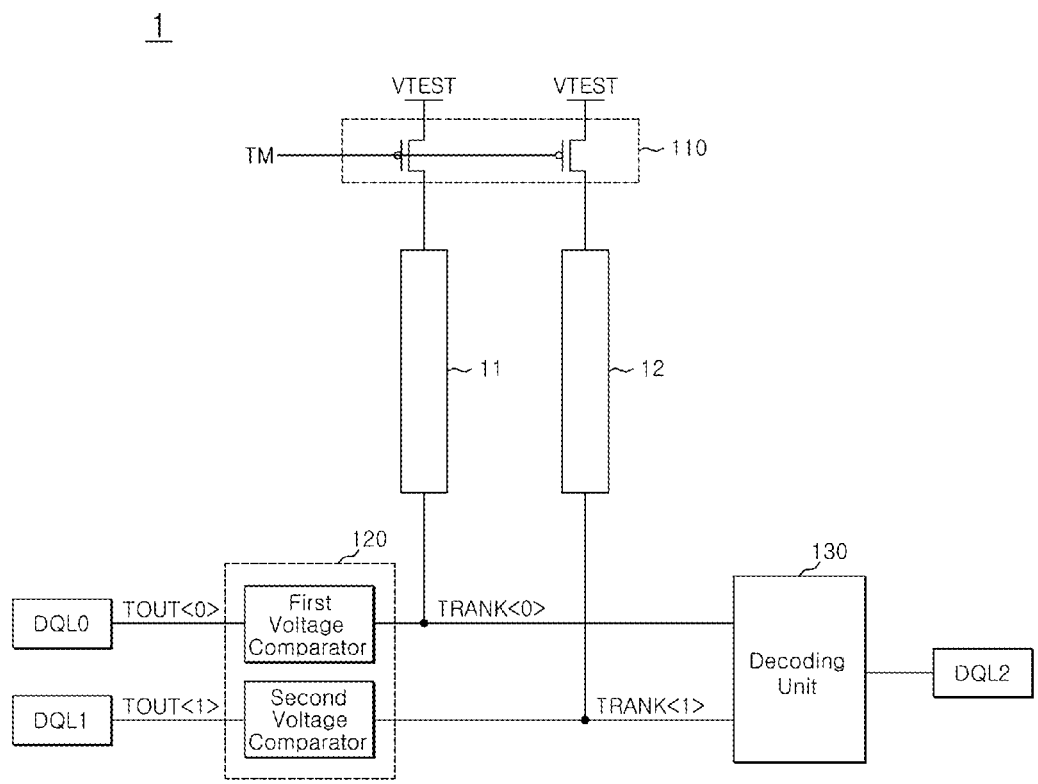
FIG. 1 schematically illustrates the configuration of a semiconductor apparatus according to an embodiment.

FIG. 1 schematically illustrates the configuration of a semiconductor apparatus 1 according to an embodiment. Referring to FIG. 1, the semiconductor apparatus includes a first TSV 11, a second TSV 12, a test voltage application unit 110, a first pad DQL0, and a second pad DQL1. The semiconductor apparatus 1 includes a plurality of stacked chips (not illustrated), and the first and second TSVs 11 and 12 electrically connect the plurality of chips.

The test voltage application unit 110 may be configured to apply a test voltage VTEST to the first and second TSVs 11 and 12 in response to a test mode signal TM. The test voltage application unit 110 may continuously apply the test voltage VTEST to the first and second TSVs 11 and 12 while a test is performed. For example, the test voltage VTEST may include a high voltage having an external voltage level, but is not limited thereto. In FIG. 1, the test voltage application unit 110 may include a plurality of transistors which are turned on in response to the test mode signal TM and apply the test voltage VTEST to one ends of the first and second TSVs 11 and 12.

The first pad DQL0 may be configured to output a first test signal TRANK<0> outputted through the first TSV 11. The first pad DQL1 may output the first test signal TRANK<0> to the outside of the semiconductor apparatus 1. Similarly, the second pad DQL1 may be configured to output a second test signal TRANK<1> outputted through the second TSV 12. The second pad DQL1 may output the second test signal TRANK<1> to the outside of the semiconductor apparatus 1. Since the first and second test signals TRANK<0> and TRANK<1> are outputted through the first and second pads DQL0 and DQL1, respectively, the first and second test signals TRANK<0> and TRANK<1> may be outputted to the outside of the semiconductor apparatus 1 substantially at the same time.

When the first and second TSVs 11 and 12 are normally formed, the first and second test signals TRANK<0> and TRANK<1> may have the test voltage level VTEST. Alternatively, a current having a predetermined value may be passed through the first and second test signals TRANK<0> and TRANK<1>. On the other hand, when the first and second test signals TRANK<0> and TRANK<1> are not normally formed but opened, the first and second test signals TRANK<0> and TRANK<1> may have a lower level than the test voltage level VTEST or may not output a voltage. Alternatively, a current having a smaller value than the predetermined value may be passed through the first and second TSVs 11 and 12, or no current may be passed. Therefore, the voltage levels or current amounts of the first and second test signals TRANK<0> and TRANK<1> may be detected to determine whether the first and second TSVs 11 and 12 are normally formed or not.

The semiconductor apparatus 1 may output voltages or currents outputted from the first and second TSVs 11 and 12 to the first and second pads DQL0 and DQL1, respectively. Therefore, since the semiconductor apparatus 1 may output test results of the plurality of TSVs to the plurality of pads at substantially the same time or the same time, the semiconductor apparatus 1 may improve the efficiency of the test for detecting a defective TSV, and reduce the test time.

In FIG. 1, the semiconductor apparatus 1 further may include a determination unit 120. The determination unit 120 may be configured to compare the first and second test signals TRANK<0> and TRANK<1> to a predetermined reference voltage, and generate first and second test result signals TOUT<0> and TOUT<1>, respectively. The determination unit 120 may include first and second voltage comparators configured to compare the first and second test signals TRANK<0> and TRANK<1> to the reference voltage and generate the first and second test result signals TOUT<0> and TOUT<1>, respectively. The first test result signal TOUT<0> may be outputted through the first pad DQL0, and the second test result signal TOUT<1> may be outputted through the second pad DQL1.

The first and second test signals TRANK<0> and TRANK<1> are voltages outputted from the first and second TSVs 11 and 12 or currents flowing through the first and second TSVs 11 and 12. That is, the first and second test signals TRANK<0> and TRANK<1> are analog signals. Therefore, in order to determine whether the first and second TSVs 11 and 12 are normally formed or not, an additional test device is required, which is capable of measuring the voltage levels or current amounts of the first and second test signals TRANK<0> and TRANK<1> when the first and second test signals TRANK<0> and TRANK<1> are outputted through the first and second pads DQL0 and DQL1. However, the determination unit 120 may convert the analog signals into digital logic signals such that an additional test device is not required. That is, the determination unit 120 may convert the first and second test signals TRANK<0> and TRANK<1> as analog signals into the first and second test result signals TOUT<0> and TOUT<1> as digital signals. For example, the reference voltage may have a half level of the test voltage, but is not limited thereto. Therefore, the first and second voltage comparators may compare the first and second test signals TRANK<0> and TRANK<1> to the reference voltage, and generate the first and second test result signals TOUT<0> and TOUT<1> having a high or low level. Outside the semiconductor apparatus, the test result may be determined only by monitoring the first and second test result signals TOUT<0> and TOUT<1> outputted through the first and second pads DQL0 and DQL1. Therefore, an additional test device is not required.

In FIG. 1, the semiconductor apparatus 1 may include a decoding unit 130 and a third pad DQL2. The decoding unit 130 may be configured to decode the first and second test signals TRANK<0> and TRANK<1>. The third pad DQL2 may be configured to output an output signal of the decoding unit 130 to the outside of the semiconductor apparatus 1. The decoding unit 130 may sequentially output the first and second test signals TRANK<0> and TRANK<1>, or add and output the first and second test signals TRANK<0> and TRANK<1>. The decoding unit 130 is an element which is added to the semiconductor apparatus 1 so as to perform a test using a conventional test device, that is, a test device capable of measuring a voltage level or current amount.

Figure 2:
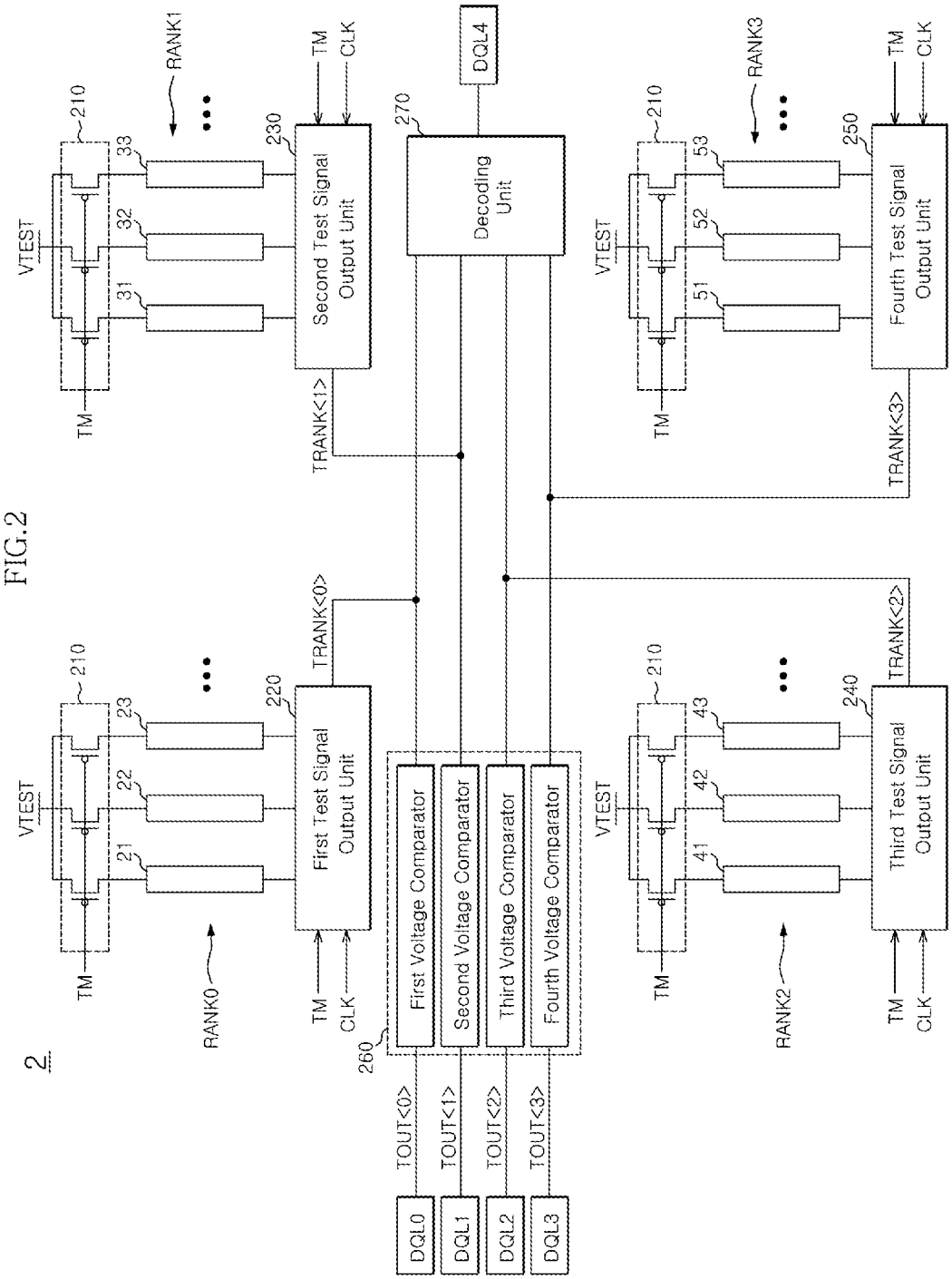
FIG. 2 schematically illustrates the configuration of a semiconductor apparatus according to an embodiment.

FIG. 2 schematically illustrates the configuration of a semiconductor apparatus 2 according to an embodiment. Referring to FIG. 2, the semiconductor apparatus 2 may include a plurality of stacked chips (not illustrated) and a plurality of TSVs 21 to 23, 31 to 33, 41 to 43, and 51 to 53 which electrically connect the plurality of chips. The plurality of TSVs 21 to 23, 31 to 33, 41 to 43, and 51 to 53 may be divided into a plurality of ranks. Specifically, the first to third TSVs 21 to 23 may be configured to form a first rank RANK0, the fourth to sixth TSVs 31 to 33 may be configured to form a second rank RANK1, the seventh to ninth TSVs 41 to 43 may be configured to form a third rank RANK2, and the tenth to 12th TSVs 51 to 53 may be configured to form a fourth rank RANK3.

The semiconductor apparatus 2 also may include a test voltage application unit 210, first to fourth test signal output units 220 to 250, and first to fourth pads DQL0 to DQL3. The test voltage application unit 210 may be commonly connected to the plurality of TSVs 21 to 23, 31 to 33, 41 to 43, and 51 to 53, and may be configured to apply a test voltage VTEST to the TSVs 21 to 23, 31 to 33, 41 to 43, and 51 to 53 in response to a test mode signal TM.

The first test signal output unit 220 may be sequentially connected to the first to third TSVs 21 to 23 forming the first rank RANK0. The first test signal output unit 220 may be sequentially connected to the first to third TSVs 21 to 23, and sequentially provide signals outputted through the first to third TSVs 21 to 23 as a first test signal TRANK<0>.

The second test signal output unit 230 may be sequentially connected to the fourth to sixth TSVs 31 to 33 forming the second rank RANK1. The second test signal output unit 230 may be sequentially connected to the fourth to sixth TSVs 31 to 33, and sequentially provide signals outputted through the fourth to sixth TSVs 31 to 33 as a second test signal TRANK<1>.

The third test signal output unit 240 may be sequentially connected to the seventh to ninth TSVs 41 to 43 forming the third rank RANK2. The third test signal output unit 240 may be sequentially connected to the seventh to ninth TSVs 41 to 43, and sequentially provide signals outputted through the seventh to ninth TSVs 41 to 43 as a third test signal TRANK<2>.

The fourth test signal output unit 250 may be sequentially connected to the tenth to 12th TSVs 51 to 53 forming the fourth rank RANK3. The fourth test signal output unit 250 may be sequentially connected to the tenth to 12th TSVs 51 to 53, and sequentially provide signals outputted through the tenth to 12th TSVs 51 to 53 as a fourth test signal TRANK<3>.

The first to fourth test signal output units 220 to 250 may output the first to fourth test signals TRANK<0> to TRANK<3> in response to the test mode signal TM and a clock signal CLK. When the test mode signal TM is enabled, the first to fourth test signal output units 220 to 250 may be sequentially connected to the TSVs 21 to 23, 31 to 33, 41 to 43, and 51 to 53 of the first to fourth ranks RANK0 to RANK3 in synchronization with the clock signal CLK, and sequentially output signals outputted through the TSVs 21 to 23, 31 to 33, 41 to 43, and 51 to 53 of the first to fourth ranks RANK0 to RANK3 as the first to fourth test signals TRANK<0> to TRANK<3>. For example, when the test mode signal TM is enabled, the first to fourth test signal output units 220 to 250 may be connected to the first TSV 21 of the first rank RANK0, the fourth TSV 31 of the second rank RANK1, the seventh TSV 41 of the third rank RANK2, and the tenth TSV 51 of the fourth rank RANK3 at a first rising edge of the clock signal CLK, and output signals outputted through the first TSV 21, the fourth TSV 31, the seventh TSV 41, and the tenth TSV 51 as the first to fourth test signals TRANK<0> to TRANK<3>, respectively. Furthermore, the first to fourth test signal output units 220 to 250 may be connected to the second TSV 22 of the first rank RANK0, the fifth TSV 32 of the second rank RANK1, the eighth TSV 42 of the third rank RANK2, and the 11th TSV 52 of the fourth rank RANK3 at a second rising edge of the clock signal CLK, and output signals outputted through the second TSV 22, the fifth TSV 32, the eighth TSV 42, and the 11th TSV 52 as the first to fourth test signals TRANK<0> to TRANK<3>, respectively. Similarly, the first to fourth test signal output units 220 to 250 may output signals outputted through the third TSV 23, the sixth TSV 33, the ninth TSV 43, and the 12th TSV 53 as the first to fourth test signals TRANK<0> to TRANK<3>, respectively, at a third rising edge of the clock signal CLK.

The first pad DQL0 outputs the first test signal TRANK<0> outputted from the first test signal output unit 220 to the outside of the semiconductor apparatus 2, and the second pad DQL1 outputs the second test signal TRANK<1> outputted from the second test signal output unit 230 to the outside of the semiconductor apparatus 2. Similarly, the third pad DQL2 outputs the third test signal TRANK<2> outputted from the third test signal output unit 240 to the outside of the semiconductor apparatus 2, and the fourth pad DQL3 outputs the fourth test signal TRANK<3> outputted from the fourth test signal output unit 250 to the outside of the semiconductor apparatus 2.

The first to fourth test signal output units 220 to 250 of the semiconductor apparatus 2 are sequentially connected to the TSVs 21 to 23, 31 to 33, 41 to 43, and 51 to 53 forming the first to fourth ranks RANK0 to RANK3, respectively, and sequentially output signals outputted through the TSVs 21 to 23, 31 to 33, 41 to 43, and 51 to 53 forming the first to fourth ranks RANK0 to RANK3 as the first to fourth test signals TRANK<0> to TRANK<3>, respectively. Therefore, since the test can be performed on one TSV for each rank at a time, the test time may be reduced by a multiple of the number of ranks.

In FIG. 2, the semiconductor apparatus 2 may further include a determination unit 260. The determination unit 260 may be configured to compare the first to fourth test signals TRANK<0> to TRANK<3> to a reference voltage and generate first to fourth test result signals TOUT<0> to TOUT<3>. The determination unit 260 may include first to fourth voltage comparators configured to compare the first to fourth test signals TRANK<0> to TRANK<3> to the reference voltage and generate the first to fourth test result signals TOUT<0> to TOUT<3>, respectively. The first to fourth test result signals TOUT<0> to TOUT<3> are digital logic signals having a high or low level. The first to fourth test result signals TOUT<0> to TOUT<3> may be outputted to the first to fourth pads DQL0 to DQL3, respectively.

In FIG. 2, the semiconductor apparatus 2 may further include a decoding unit 270 and a fifth pad DQL4. The decoding unit 270 may be configured to decode the first to fourth test signals TRANK<0> to TRANK<3>, and the fifth pad DQL4 may be configured to output an output signal of the decoding unit 270 to the outside of the semiconductor apparatus 2.

Figure 3:
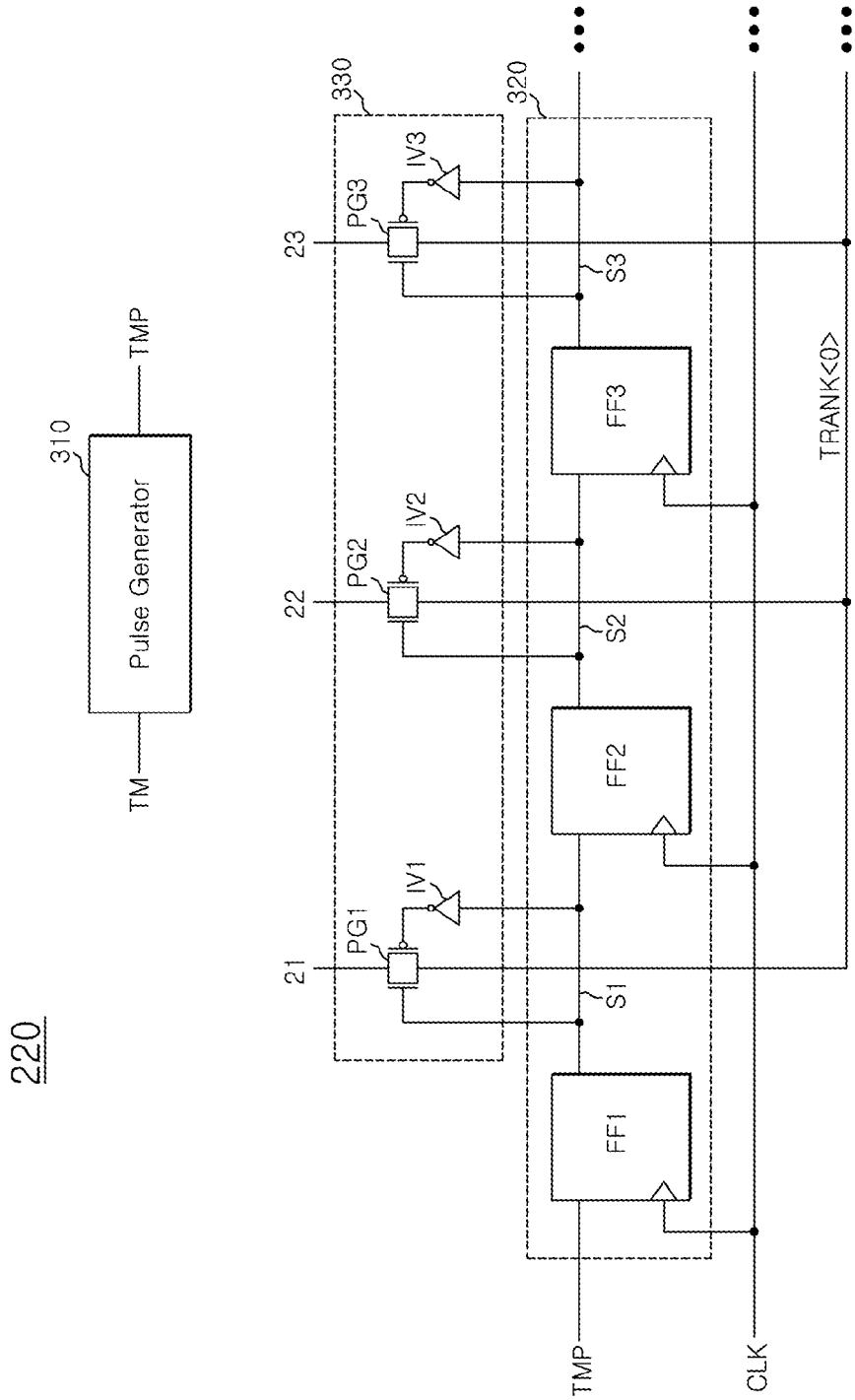
FIG. 3 illustrates the configuration of a first test signal output unit of FIG. 2.

FIG. 3 illustrates the configuration of the first test signal output unit 220 of FIG. 2. Referring to FIG. 3, the first test signal output unit 220 may include a pulse generator 310, a select signal generator 320, and a selector 330. The pulse signal generator 310 may be configured to generate a pulse signal TMP having a predetermined pulse width when the test mode signal TM is enabled. The select signal generator 320 may be configured to generate a plurality of select signals S1 to S3 in response to the pulse signal TMP and the clock signal CLK. The selector 330 may be sequentially connected to the TSVs 21 to 23 of the first rank RANK0 in response to the plurality of select signals S1 to S3, and may sequentially provide signals outputted through the TSVs 21 to 23 of the first rank RANK0 as the first test signal TRANK<0>.

In FIG. 3, the select signal generator 320 may include first to third flip-flops FF1 to FF3. The first to third flip-flops FF1 to FF3 may be connected in series to generate the select signals S1 to S3. The first flip-flop FF1 may generate the first select signal S1 in synchronization with the clock signal CLK, when the pulse signal TMP is generated. The second flip-flop FF2 may receive the first select signal S1, and generate the second select signal S2 in synchronization with the clock signal CLK. The third flip-flop FF3 may receive the second select signal S2, and generate the third select signal S3 in synchronization with the clock signal CLK. Since the second and third flip-flops FF2 and FF3 receive output signals of the first and second flip-flops FF1 and FF2, respectively, the enable periods of the first to third select signals S1 to S3 do not overlap each other, and may be sequentially generated.

The selector 330 may include first to third pass gates PG1 to PG3. The first to third pass gates PG1 to PG3 may be connected to the first to third TSVs 21 to 23, respectively, and selectively transmit signals outputted through the first to third TSVs 21 to 23. The first pass gate PG1 may provide a signal outputted through the first TSV 21 as the first test signal TRANK<0> in response to the first select signal S1 and an inverted signal of the first select signal S1 (obtained by a first inverter IV1), the second pass gate PG2 may provide a signal outputted through the second TSV 22 as the first test signal TRANK<0> in response to the second select signal S2 and an inverted signal of the second select signal S2 (obtained by a second inverter IV2), and the third pass gate PG3 may provide a signal outputted through the third TSV 23 as the first test signal TRANK<0> in response to the third select signal S3 and an inverted signal of the third select signal S3 (obtained by a third inverter IV3). Therefore, the signals outputted through the first to third TSVs 21 to 23 may be sequentially provided as the first test signal TRANK<0>. The second to fourth test signal output units 230 to 250 may have substantially the same configuration as the first test signal output unit 220.

While various embodiments have been described above, it will be understood to those skilled in the art that the embodiments described are by way of example only. Accordingly, the semiconductor apparatus described herein should not be limited based on the described embodiments.

What is claimed is:

1. A semiconductor apparatus which includes a plurality of chips stacked therein and first and second through-silicon vias (TSVs) electrically connecting the plurality of chips, comprising:
   a test voltage application unit configured to apply a test voltage to the first and second TSVs in response to a test mode signal;
   a first pad configured to output a first test signal outputted from the first TSV; and
   a second pad configured to output a second test signal outputted from the second TSV,
   wherein the first and second test signals are outputted to the outside of the semiconductor apparatus through the first and second pads, respectively, substantially at the same time.

2. The semiconductor apparatus according to claim 1, further comprising a determination unit configured to compare the first and second test signals to a predetermined reference voltage and generate first and second test result signals,
   wherein the first and second test result signals are outputted through the first and second pads, respectively.

3. The semiconductor apparatus according to claim 2, wherein the first and second test signals comprise analog signals, and the first and second test result signals comprise digital signals.

4. The semiconductor apparatus according to claim 1, further comprising:
   a decoding unit configured to decode the first and second test signals; and
   a third pad configured to receive an output signal of the decoding unit and output the received signal.

5. A semiconductor apparatus which includes a plurality of chips and a plurality of TSVs electrically connecting the plurality of chips and divided into first and second ranks, comprising:
   a test voltage application unit configured to apply a test voltage to the plurality of TSVs in response to a test mode signal;
   a first test signal output unit sequentially connected to the TSVs of the first rank and configured to output a first test signal;
   a second test signal output unit sequentially connected to the TSVs of the second rank and configured to output a second test signal;
   a first pad configured to output the first test signal; and
   a second pad configured to output the second test signal.

6. The semiconductor apparatus according to claim 5, wherein each of the first and second test signal output units comprises:
   a select signal generator configured to generate a plurality of select signals in synchronization with a clock signal when the test mode signal is enabled; and
   a selector configured to provide signals outputted from the TSVs of the first and second ranks as the first and second test signals in response to the plurality of select signals.

7. The semiconductor apparatus according to claim 6, wherein the first test signal output unit and the second test signal output unit further comprise:
   a pulse generator configured to generate a pulse signal having a predetermined pulse width in response to the test mode signal; and
   wherein each of the select signal generators comprise a flip-flop for receiving the pulse signal.

8. The semiconductor apparatus according to claim 5, further comprising a determination unit configured to compare the first and second test signals to a predetermined reference voltage and generate first and second test result signals,
   wherein the first and second test result signals are outputted through the first and second pads, respectively.

9. The semiconductor apparatus according to claim 5, further comprising:
   a decoding unit configured to decode the first and second test signals; and
   a third pad configured to receive an output signal of the decoding unit and output the received signal to the outside of the semiconductor apparatus.

10. A test method of a semiconductor apparatus which includes a plurality of chips and first and second TSVs electrically connecting the plurality of chips, the test method comprising the steps of:
    applying a test voltage to the first and second TSVs;
    converting signals outputted through the first and second TSVs into first and second digital signals, respectively; and
    outputting the first and second digital signals to first and second pads, respectively,
    wherein the first and second digital signals are outputted to the outside of the semiconductor apparatus through the first and second pads, respectively, substantially at the same time.

11. The test method according to claim 10, further comprising:
    decoding the signals outputted through the first and second TSVs; and
    outputting the decoded signals through a third pad.

12. The test method according to claim 10, wherein the decoded signals are sequentially outputted through the third pad or the decoded signals are added and outputted through the third pad.

13. A test method of a semiconductor apparatus which includes a plurality of chips and a plurality of TSVs electrically connecting the plurality of chips and divided into first and second ranks, the test method comprising the steps of:
    applying a test voltage to the plurality of TSVs;
    outputting signals outputted from one of the TSVs of the first rank and one of the TSVs of the second rank to first and second pads, respectively; and
    outputting signals outputted from another of the TSVs of the first rank and another of the TSVs of the second rank to the first and second pads, respectively.

14. The test method according to claim 13, further comprising the step of, before the step of outputting signals outputted from one of the TSVs of the first rank and one of the TSVs of the second rank to first and second pads, respectively, converting the outputted signals into the digital signals.

15. The test method according to claim 13, further comprising the step of, before the step of outputting signals outputted from another of the TSVs of the first rank and another of the TSVs of the second rank to the first and second pads, respectively, converting the outputted signals into the digital signals.

* * * * *